United States Patent
Kwon et al.

[19]

[11] Patent Number: 5,854,566
[45] Date of Patent: Dec. 29, 1998

[54] RESURF EDMOS TRANSISTOR AND HIGH-VOLTAGE ANALOG MULTIPLEXER CIRCUIT USING THE SAME

[75] Inventors: Oh-Kyong Kwon, Seoul; Koan-Yel Jeong, Kyungsangnam-Do, both of Rep. of Korea

[73] Assignee: LG Semicon Co., Ltd., Cheongju, Rep. of Korea

[21] Appl. No.: 588,948

[22] Filed: Jan. 19, 1996

[30] Foreign Application Priority Data

Oct. 13, 1995 [KR] Rep. of Korea .................. 35381/1995

[51] Int. Cl.$^6$ .................. H03K 5/01; G06F 3/00
[52] U.S. Cl. .................. 327/403; 327/404; 327/407; 327/408; 327/99
[58] Field of Search .................. 327/403, 404, 327/407, 408, 409, 410, 389, 564, 565, 566, 298, 365, 99, 379, 390

[56] References Cited

U.S. PATENT DOCUMENTS

| | | | |
|---|---|---|---|
| 5,070,255 | 12/1991 | Shin | 327/408 |
| 5,162,666 | 11/1992 | Tran | 327/408 |
| 5,323,044 | 6/1994 | Rumennik et al. | 257/379 |
| 5,430,403 | 7/1995 | Moyer et al. | 327/365 |

*Primary Examiner*—Dinh Le
*Attorney, Agent, or Firm*—Fleshner & Kim

[57] ABSTRACT

A bi-directional high-voltage RESURF EDMOS (REduced SURface Extended Drain MOS) transistor which can endure a high voltage at its source by providing drift regions at both sides, i.e., the source and drain of the conventional RESURF LDMOS (Lateral DMOS) transistor, and exchanging the drain and the source when an analog signal of high voltage is inputted. Further, the bi-directional high-voltage RESURF EDMOS transistor provides a high-voltage analog multiplexer circuit employing a RESURF EDMOS transistor which is capable of reducing the number of necessary high-voltage elements and performing a stable operation, by constructing a high-voltage analog multiplexer having at least three inputs and a multistage high-voltage multiplexer circuit of push-pull type, pass transistor type, and combined form of push-pull type and pass transistor type by using the bi-directional high-voltage RESURF EDMOS transistor. Additionally, in the case where a multistage high-voltage multiplexer such as for an LSI for driving a display is necessary, a high-voltage multiplexer is realized, whereby the LSI chip size is reduced in accordance with reduction of the number of high voltage elements and the chip resistance value for the LSI chip can be reduced.

11 Claims, 6 Drawing Sheets

RESURF EDMOS TRANSISTOR AND HIGH-VOLTAGE ANALOG MULTIPLEXER CIRCUIT USING THE SAME

BACKGROUND OF THE INVENTION

1. Field of the Invention

The present invention relates to a high-voltage analog multiplexer circuit, and particularly to a RESURF (REduced SURface Field) EDMOS (extended Drain MOS) transistor and a high-voltage analog multiplexer circuit using the same which are capable of reducing the number of required high-voltage elements and performing a stable operation, by realizing a bi-directional RESURF EDMOS element and including a high-voltage analog multiplexer having at least three inputs and a multistage high-voltage multiplexer circuit having a hierarchical structure.

2. Description of the Conventional Art

Generally, high-voltage elements include a DMOS (Double Diffused MOS) transistor, IGBT (Insulated Gate Bipolar Transistor) whose gate is insulated, and a BT (Bipolar Transistor). An LDMOS (Lateral DMOS) transistor is used for high-voltage (10 V to 500 V) operation, which is compatible with the CMOS VLSI for low-voltage.

Among the LDMOS transistors for high-voltage, a RESURF LDMOS is developed as an element having excellent resistance characteristics for a determined chip size and capable of easily constructing the VLSI.

Referring to FIG. 2A, in the RESURF LDMOS transistor, n-type impurities are ion-implanted on a P-type silicon substrate, and form a drift region, i.e., an n-well region 4 via the diffusion process and a thick thermal oxide film, i.e., a field oxide film.

Thereafter, a gate oxide film and a polysilicon gate electrode 6 are formed. After self-aligning with the polysilicon gate electrode 6, p-type impurities are ion-implanted, and a p-well 3 is formed via the diffusion process. Afterwards, using an n+ mask, n– impurities are ion-implanted, and using a p+ mask, p– impurities are ion-implanted. After depositing a silicon oxide film, an annealing is performed at a temperature between 850° C. to 1000° C. to alleviate damage generated during ion-implanting the n+ and p+ impurities. For electrical contacting of a source and a drain, the deposited silicon oxide film is etched using a contact mask, and a source contact terminal and a drain contact terminal are formed by depositing and etching a metal thin film.

However, as shown in FIG. 2B, the RESURF LDMOS transistor is only used as a low side driver. Particularly, as the RESURF LDMOS transistor is a mono-directional element whose source and drain are fixed, it is impossible to charge/discharge bidirectionally, and thereby it cannot be used as a push-pull type high-voltage analog multiplexer having at least three analog inputs.

Further, conventional high-voltage analog multiplexer circuits which output one input voltage of two analog input voltages include a transmission gate type, a pass transistor type and a push-pull type high-voltage analog multiplexer circuit.

First, the transmission gate type high-voltage analog multiplexer 10, as shown in FIG. 1A, includes a bi-directional high-voltage transmission gate 110 having one high-voltage NMOS transistor and one high-voltage PMOS transistor, for outputting an analog voltage OUT via a common node 112 in accordance with an externally inputted clock signal CK1; and a bi-directional high-voltage transmission gate 111 having one high-voltage NMOS transistor and one high-voltage PMOS transistor, for outputting an analog input voltage V2 via the common node 112 in accordance with an externally inputted clock signal CK2.

A pass transistor type high-voltage analog multiplexer having two inputs, as shown in FIG. 1B, includes a high-voltage NMOS transistor 113 having its source receiving the analog voltage V1, its gate receiving the clock signal CK1, and its drain connected to a common node 115; and a high-voltage NMOS transistor 114 having its source receiving the analog voltage V2, its gate receiving the clock signal CK2, and its drain connected to the common node 115.

Additionally, the push-pull type high-voltage analog multiplexer having two inputs, as shown in FIG. 1C, includes a high-voltage PMOS transistor 116 having its source receiving the analog voltage V1, its gate receiving the clock signal CK1, and its drain connected to a common node 118; and a high-voltage NMOS transistor 117 having its source receiving the analog voltage V2, its gate receiving the clock signal CK2, and its drain connected to the common node 118.

The operation of the conventional high-voltage analog multiplexer having two inputs, having the above-described structure will be explained, with reference to the drawings.

First, when the analog voltages V1 and V2 are inputted to the transmission gates 110 and 111 of the transmission gate type high-voltage analog multiplexer 10, the transmission gate 110 or the transmission gate 111 is turned on in accordance with the inputted clock signals CK1 and CK2, and thereby the analog voltages V1 and V2 are selectively outputted to the common node 112.

Further, the pass transistor type high-voltage analog multiplexer, when the analog voltages V1 and V2 are respectively applied to the gates of the NMOS transistors 113 and 114, selectively outputs the analog voltages V1 and V2 to the common node 115 in accordance with the clock signals CK1 and CK2 inputted to the gates of the NMOS transistor 113 and 114, respectively.

On the other hand, when the analog voltages V1 and V2 are respectively inputted to the sources of the high-voltage PMOS transistor 116 and the high-voltage NMOS transistor 117, the push-pull type high-voltage analog multiplexer selectively outputs the analog voltages V1 and V2 to the common node 118 in accordance with the clock signals CK1 and CK2 respectively inputted to the gates of the mono-directional high-voltage PMOS transistor 116 and the mono-directional high-voltage NMOS transistor 117.

However, in the case of the high-voltage analog multiplexer having at least three analog inputs, there are problems in that the area required for overall layout is increased due to the increase in the number of element, and the oxide film of the gate should be made thick for preventing the breakdown of the gate because the voltage level of the inputted clock signals CK1 and CK2 should be similar to the voltage level of the input signals V1 and V2.

Further, for the pass transistor type analog multiplexer, in the case where the values of the analog voltages V1 and V2 are larger than the voltage level of the clock signals CK1 and CK2 applied at the respective gates of the high-voltage NMOS transistor 113 and 114, there is a disadvantage in that the analog voltages V1 and V2 are not transmitted to the output terminal. When constructing the pass transistor type high-voltage analog multiplexer using two (2) mono-directional high-voltage RESURF LDMOS transistors, the source terminals of the RESURF LDMOS transistors should endure high voltages.

Additionally, in the case of constructing the push-pull type high-voltage analog multiplexer having three inputs by using the mono-directional high-voltage RESURF LDMOS transistors, one high-voltage PMOS transistor and two (2) high-voltage NMOS transistors are required. And, to normally operate the circuit, the voltage level inputted at the sources of the two NMOS transistors should be made lower than the respective clock signals of high level applied at the gates of the transistors.

SUMMARY OF THE INVENTION

Therefore, it is an object of the present invention to provide a bi-directional high-voltage RESURF EDMOS transistor which is capable of enduring a high voltage at its source terminal, by providing drift regions at both sides, i.e., the source and drain of the conventional RESURF LDMOS transistor, and exchanging the drain and source when an analog signal of high-voltage is inputted.

It is another object of the present invention to provide a high-voltage analog multiplexer circuit employing a RESURF EDMOS transistor which is capable of reducing the number of required high-voltage elements and performing a stable operation, by constructing a high-voltage analog multiplexer having at least three inputs and a multistage high-voltage multiplexer circuit of push-pull type, pass transistor type, and combined form of push-pull type and pass transistor type by using the bi-directional high-voltage RESURF EDMOS transistor.

To achieve the above-mentioned objects, the high-voltage analog multiplexer circuit includes a high-voltage NMOS transistor and a high-voltage PMOS transistor. First, the high-voltage NMOS transistor includes a channel region 9 having a P-well region 7 being formed by diffusing P-type impurities on a P-type silicon substrate and a polysilicon gate 23 connected to a gate contact terminal 24 via a gate oxide film 22 provided on the surface of the P-well region 7; a source region 10 having a P+ doping region 16 connected with the P+ body contact terminal 17 between field oxide films 12 and 13 within the P-well region 7, an N+ doping region 15 connected to a source/drain contact terminal 19 between field oxide films 13 and 14, and a drift region 21 formed between an N+ doping region 15 and the channel region 9; and a drain region 11 having a P+ doping region 16 connected with P+ body contact terminal 17 between the field oxide films 12 and 13, an N+ doping region 15 connected with a drain/source contact terminal 20 between the field oxide films 13 and 14, and a drift region 21 formed between the N+ doping region 15 and the channel region 9.

On the other hand, the high-voltage PMOS transistor includes a channel region 9 having an N-well region 8 being formed by diffusing N-type impurities on an N-type silicon substrate and a polysilicon gate 18 connected to a gate contact terminal 24 via a gate oxide film 22 provided on the surface of the N-well region 8; a source region 10 having an N+ doping region 15 connected with an N+ body contact terminal 18 between field oxide films 12 and 13 within the N-well region 8, a P+ doping region 16 connected with a source/drain contact terminal 19 between field oxide films 13 and 14, and a drift region 21 formed between the P+ doping region 16 and the channel region 9; and a drain region 11 having an N+ doping region 15 connected with N+ body contact terminal 18 between the field oxide films 12 and 13, an P+ doping region 16 connected with a drain/source contact terminal 20 between field oxide films 13 and 14, and a drift region 21 formed between the P+ doping region 16 and the channel region 9.

In the high-voltage analog multiplexer having at least three inputs according to the present invention, a transistor which receives a signal of highest level among the input signals employs a mono-directional high-voltage PMOS transistor, and a transistor which receives a signal of lowest level among the input signals employs a mono-directional high-voltage NMOS transistor. And, a transistor which receives the remaining input signals employs a bi-directional high-voltage NMOS transistor and a bi-directional high-voltage PMOS transistor, thereby constructing high-voltage multiplexers of push-pull type, pass transistor type, and a combined form of push-pull type and pass transistor type.

In the case where multiple high-voltage analog multiplexers are required such as in an LSI for driving a display, the present invention includes a common multiplexer for selectively outputting the inputted analog voltages in accordance with the clock signals applied at its gate; and a multiplexer array unit for receiving an output of the common multiplexer via a third common source line and other analog voltages via first and second common source lines, and for selectively outputting one analog voltage in accordance with externally inputted clock signals.

BRIEF DESCRIPTION OF THE DRAWINGS

The above object and advantages of the present invention will be more clearly understood from the following detailed description taken in conjunction with the accompanying drawings, in which:

FIGS. 1A to 1C show a conventional high-voltage analog multiplexer having 2 inputs, in which;

FIG. 1A is a circuit diagram showing a transmission gate type high-voltage analog multiplexer;

FIG. 1B is a circuit diagram showing a pass gate type high-voltage analog multiplexer; and FIG. 1C is a circuit diagram showing a push-pull type high-voltage analog multiplexer;

DETAILED DESCRIPTION OF THE PREFERRED EMBODIMENTS

Figure 1A:
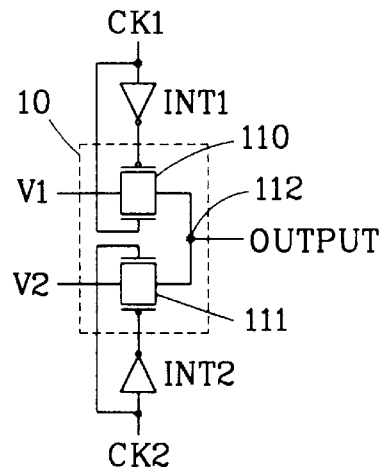
Figure 1B:
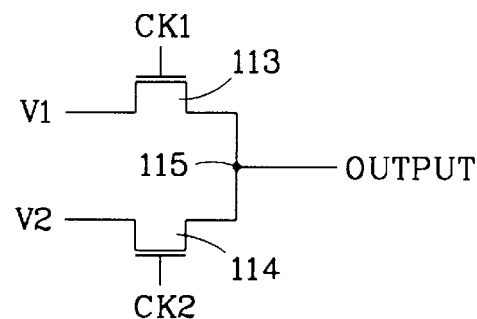
Figure 1C:
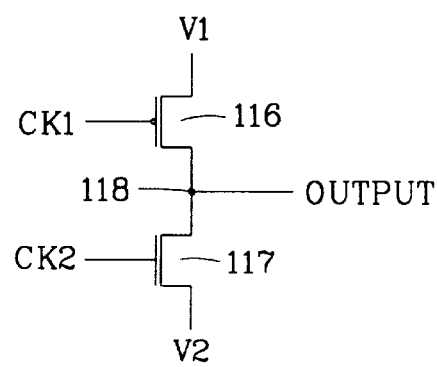
Figure 2A:
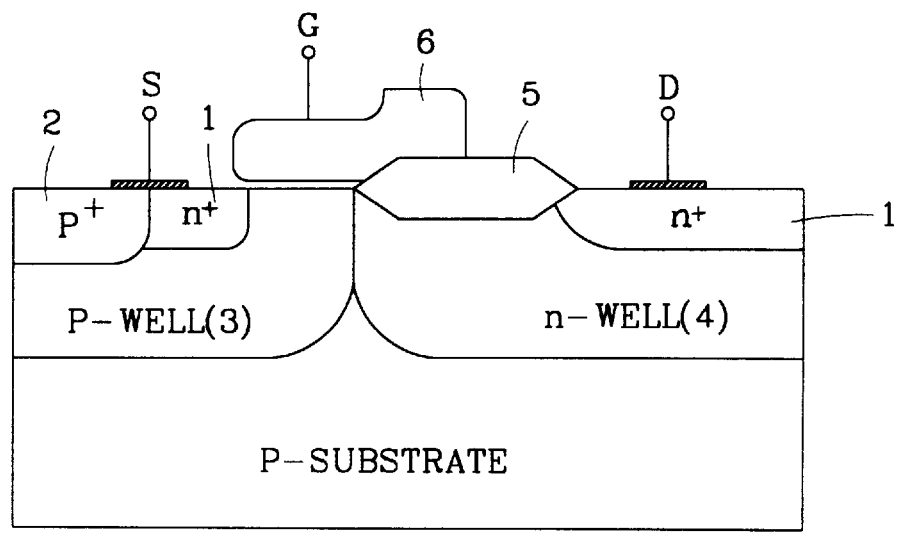
FIGS. 2A and 2B are a cross-sectional diagram and a circuit diagram, respectively, of a conventional RESURF LDMOS transistor.
Figure 2B:
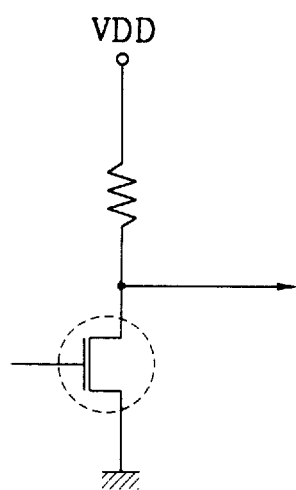
Figure 3A:
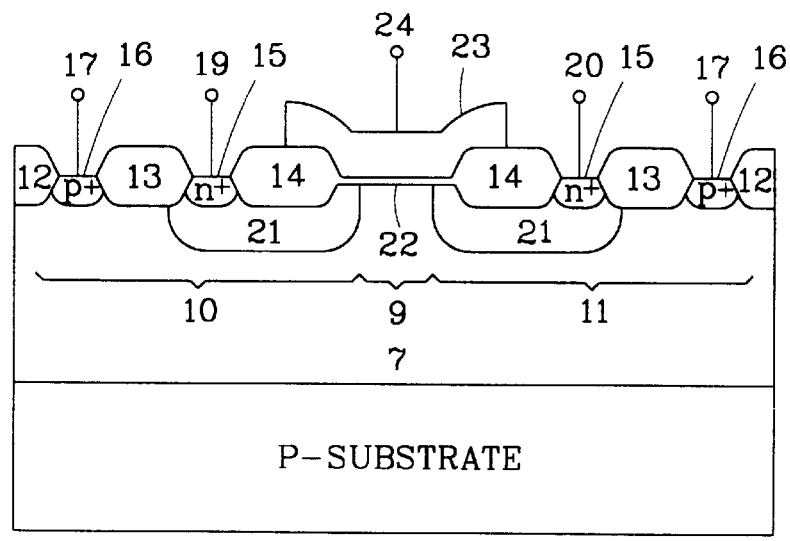
FIGS. 3A and 3B are cross-sectional diagrams of a bi-directional high-voltage RESURF EDMOS transistor according to the present invention.

Referring to FIG. 3A, there is shown a cross-sectional diagram of a high-voltage NMOS transistor of the RESURF EDMOS transistor type according to the present invention. As shown in FIG. 3A, the high-voltage NMOS transistor includes a channel region 9 having a P-well region 7 being formed by diffusing P-type impurities on a P-type silicon substrate and a polysilicon gate 23 connected to a gate contact terminal 24 via a gate oxide film 22 provided on the surface of the P-well region 7; a source region 10 having a P+ doping region 16 connected with a P+ body contact terminal 17 between field oxide films 12 and 13 within the P-well region 7, an N+ doping region 15 connected to a source/drain contact terminal 19 between field oxide films 13 and 14, and a drift region 21 formed between the N+ doping region 15 and the channel region 9; and a drain region II having a P+ doping region 16 connected with a P+ body contact terminal 17 between field oxide films 12 and 13, an N+ doping region 15 connected with a drain/source contact terminal 20 between field oxide films 13 and 14, and a drift region 21 formed between the N+ doping region 15 and the channel region 9.

Figure 3B:
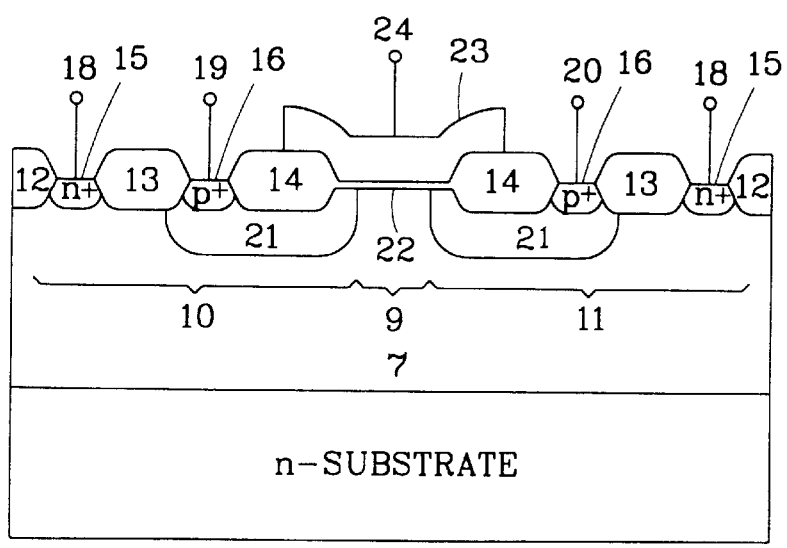

On the other hand, referring to FIG. 3B, there is shown a cross-sectional diagram of a high-voltage PMOS transistor of the RESURF EDMOS transistor type according to the present invention. As shown in FIG. 3B, the high-voltage PMOS transistor includes a channel region 9 having an N-well region 8 being formed by diffusing N-type impurities on an N-type silicon substrate and a polysilicon gate 18 connected to a gate contact terminal 24 via a gate oxide film 22 provided on the surface of the N-well region 8; a source region 10 having an N+ doping region 15 connected with an N+ body contact terminal 18 between field oxide films 12 and 13 within the N-well region 8, a P+ doping region 16 connected with a source/drain contact terminal 19 between field oxide films 13 and 14, and a drift region 21 formed between the P+ doping region 16 and the channel 15 region 9; and a drain region 11 having an N+ doping region 15 connected with an N+ body contact terminal 18 between field oxide films 12 and 13, a P+ doping region 16 connected with a drain/source contact terminal 20 between the field oxide films 13 and 14, and a drift region 21 formed between the P+ doping region 16 and the channel region 9.

Accordingly, when a signal of high or low level is inputted to the gate contact terminal 24, a channel is formed at the channel region 9, and current from the drain flows to the source via the drift region 21, thereby the one end having a high-voltage becomes drain and the other end having a low voltage becomes source. At this time, the source and the drain can be changed in accordance with the applied voltage.

Figure 4:
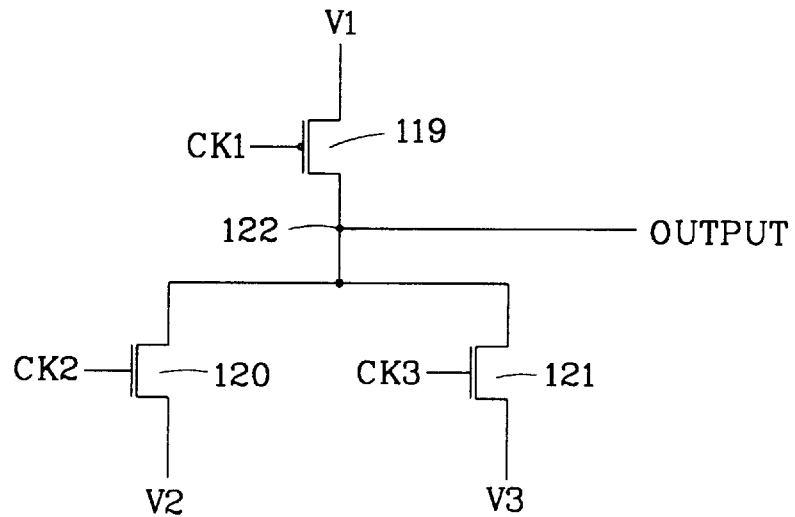
FIG. 4 is a circuit diagram showing a push-pull type high-voltage analog multiplexer having three inputs employing the RESURF EDMOS transistor of a first embodiment according to the present invention.

Referring to FIG. 4, there is shown a push-pull type high-voltage analog multiplexer circuit having three inputs employing the RESURF EDMOS transistor of a first embodiment according to the present invention, which includes a high-voltage PMOS transistor 119 having its source receiving an analog voltage V1, its gate receiving a clock signal CK1, and its drain connected to a common node 122; a high-voltage NMOS transistor 120 having its source for receiving an analog voltage V2, its gate for receiving a clock signal CK2, and its drain connected to the common node 122; and a high-voltage NMOS transistor 121 having its source for receiving an analog voltage V3, its gate for receiving a clock signal CK3, and its drain connected to the common node 122.

At this time, the high-voltage PMOS transistor 119 is a mono-directional RESURF transistor, and while the high-voltage NMOS transistor 121 NMOS transistor 120 are bi-directional RESURF EDMOS transistor.

The operation of the push-pull type high-voltage analog multiplexer having three inputs will be explained, with reference to FIG. 4.

First, in the case where the analog voltages V1, V2, and V3 are respectively applied to the sources of the high-voltage PMOS transistor 119, the high-voltage NMOS transistor 120, and the high-voltage NMOS transistor 121 in order of voltage level, when the clock signal CK1 of low level is inputted to the gate of the high-voltage PMOS transistor 119, the analog voltage V1 is outputted via the common node 122.

Thereafter, when the clock signal CK2 of high level is inputted to the gate of the high-voltage NMOS transistor 120, the source and the drain are exchanged with each other, and thereby the analog voltage V2 is outputted via the drain, the source and the common node 122. Consequently, when the clock signal CK3 of high level is inputted to the gate of the high-voltage NMOS transistor 121, the analog voltage V3 is outputted via the common mode 122. That is, in accordance with the control of the clock signal CK, the three analog signals V1, V2 and V3 are selectively outputted.

Figure 5:
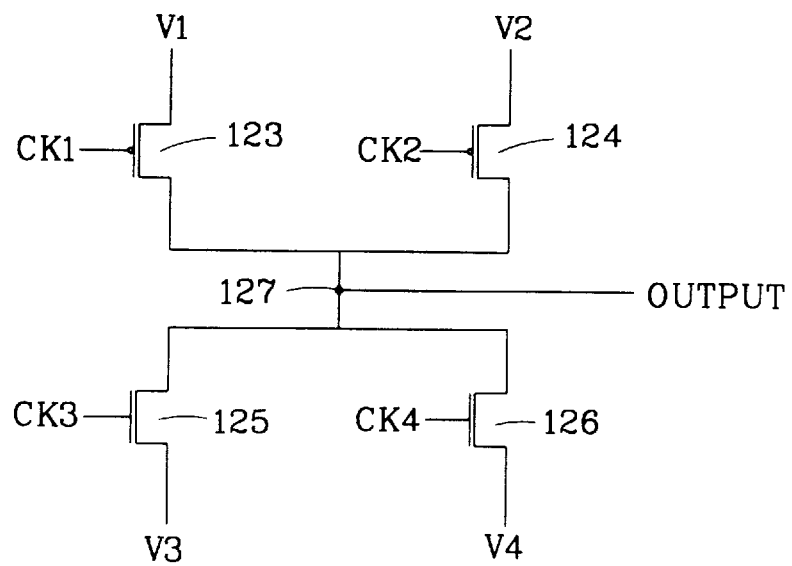
FIG. 5 is a circuit diagram showing a push-pull type high-voltage analog multiplexer having four inputs employing the RESURF EDMOS transistor of a second embodiment according to the present invention.

Referring to FIG. 5, there is shown a push-pull type high-voltage analog multiplexer circuit having four inputs of a second embodiment according to the present invention, which includes a high-voltage PMOS transistor 123 having its source receiving the analog voltage V1, its gate receiving the clock signal CK1, and its drain connected to a common node 127; a high-voltage PMOS transistor 124 having its source receiving the analog voltage V2, its gate receiving the clock signal CK2, and its drain connected to the common node 127; a high-voltage NMOS transistor 125 having its source receiving the analog voltage V3, its gate receiving the clock signal CK3, and its drain connected to the common node 127; and a high-voltage NMOS transistor 126 having its source receiving the analog voltage V4, its gate receiving the clock signal CK4, and its drain connected to the common node 127.

In the case where the analog voltage V1, V2, V3 and V4 are inputted in order of voltage level, the high-voltage PMOS transistor 123 which receives the highest voltage V1 and the high-voltage NMOS transistor 126 which receives the lowest voltage V4 are each a mono-directional RESURF LDMOS transistor, respectively. And, the high-voltage PMOS transistor 124 and the high-voltage NMOS transistor 125 are each bi-directional RESURF EDMOS transistors, respectively.

The operation of the push-pull type high-voltage analog multiplexer circuit having four inputs will be explained, referring to FIG. 5.

First, when the analog voltages V1, V2, V3 and V4 are respectively applied to the sources of the high-voltage PMOS transistors 123 and 124 and the sources of the high-voltage NMOS transistors 125 and 126, in order of voltage level, the mono-directional high-voltage PMOS transistor 123 and the bi-directional high-voltage PMOS transistor 124 output one of the voltages V1 and V2 via the common node 127 in accordance with the clock signals CK1 and CK2 both of low level applied at their respective gates. The bi-directional high-voltage NMOS transistor 125 and the mono-directional high-voltage NMOS transistor 126 output one of the voltages V3 and V4 via the common node 127 in accordance with the clock signals both of high level applied at their respective gates. That is, one of the four analog voltages V1, V2, V3 and V4 is selectively outputted in accordance with the clock signal CK.

Figure 6:
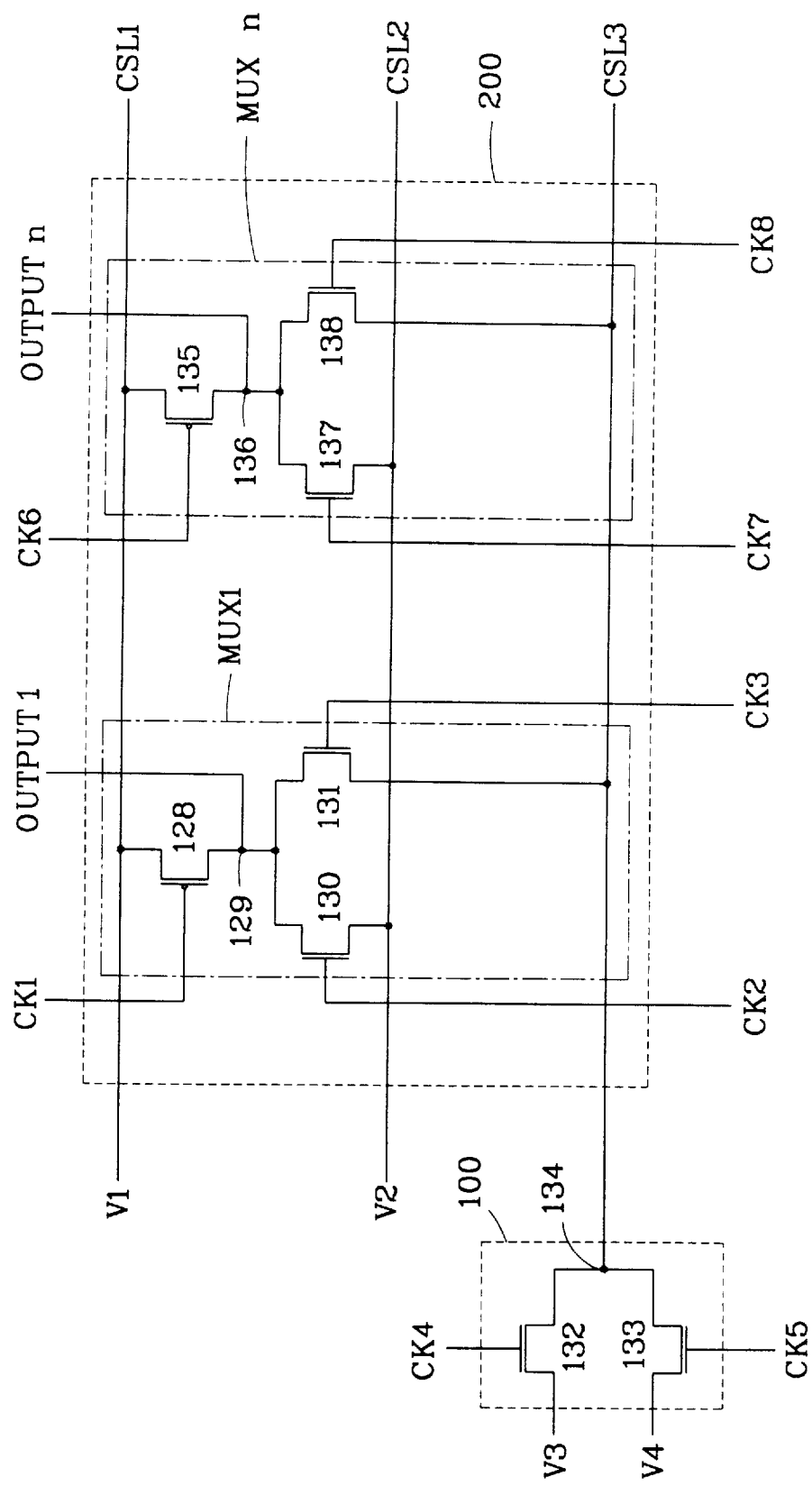
FIG. 6 is a circuit diagram showing a high-voltage analog multiplexer employing the RESURF EDMOS transistor of a third embodiment according to the present invention.

Referring to FIG. 6, there is shown a third embodiment of the present invention. As shown in FIG. 6, a high-voltage analog multiplexer array circuit having four inputs, having a hierarchical structure when a multistage high-voltage analog multiplexer such as an LSI for driving a display is required, includes a pass gate type common multiplexer 100 for selectively outputting one of the voltages V3 and V4 in accordance with externally inputted clock signals CK4 and CK5; and a multiplexer array unit 200 for receiving the output of the common multiplexer 100 via a common source line CSL3 and the analog voltages V1 and V2 via respective common source lines CSL1 and CSL2, and selectively outputting one analog voltage in accordance with the clock signals CK1, CK2 and CK3 applied at their respective gates.

The pass gate type common multiplexer 100 includes a bi-directional NMOS transistor 132 having its source receiving the analog voltage V3, its gate receiving the clock signal CK4, and a drain connected to the common source line CSL3 via a common node 134; and a bi-directional NMOS transistor 133 having its source receiving the analog voltage V4, its gate receiving the clock signal CK5, and its drain connected to the common source line CSL3 via the common node 134.

Additionally, the multiplexer array unit 200 includes a plurality of push-pull type high-voltage analog multiplexers MUX1 through MUXn each having three inputs. The multiplexer MUX1 of the plurality of the multiplexers includes a high-voltage PMOS transistor 128 having its source connected to the common source line CSL1 which receives the analog voltage V1, its gate receiving the clock signal CK1, and its drain connected to the common node 129; a high-voltage NMOS transistor 130 having its source connected to the common source line CSL2 which receives the analog voltage V2, its gate for receiving the clock signal CK2, and its drain connected to the common node 129; and a high-voltage NMOS transistor 131 having its drain connected to the common node 129, its gate receiving the clock signal CK3, and its source connected to the common source line CSL3.

When the analog voltages V1, V3, V4 and V2 are inputted in order of voltage value, the high-voltage PMOS transistor 128 which receives the highest voltage V1 and the high-voltage NMOS transistor 130 which receives the lowest voltage V2 are each mono-directional RESURF LDMOS transistors, respectively. The high-voltage PMOS transistor 132 and the high-voltage NMOS transistor 133 receiving the voltages V3 and V4, respectively, are each bi-directional RESURF EDMOS transistors. And, the multiplexers MUX 2 through MUXn are structurally the same as the multiplexer MUX1.

The operation of the third embodiment of the present invention having the above-described structure will be explained, with reference to FIG. 6.

First, when the analog voltages V1, V3, V4 and V2 are inputted in order of voltage level, the common multiplexer 100 selects one of the inputted analog voltages V3 and V4 in accordance with the clock signals CK4 and CK5 applied at their gates, and outputs the selected voltage to the multiplexer array unit 200 via the common source line CSL3.

The plurality of push-pull type high-voltage analog multiplexers MUX1 through MUXn having three inputs of the multiplexer array unit 200 each select one among the output of the common multiplexer 100 inputted via the common source line CSL3 and the analog voltages V1 and V2 respectively inputted via the common source lines CSL1 and CSL2 in accordance with the clock signals CK applied at its gates, and outputs the selected one to the respective output terminals OUT1 to OUTn.

The operation of the plurality of the push-pull type high-voltage analog multiplexers MUX1 through MUXn having three inputs are similar to the operation of the first embodiment of the present invention, and thus detailed description thereof is omitted.

Figure 7:
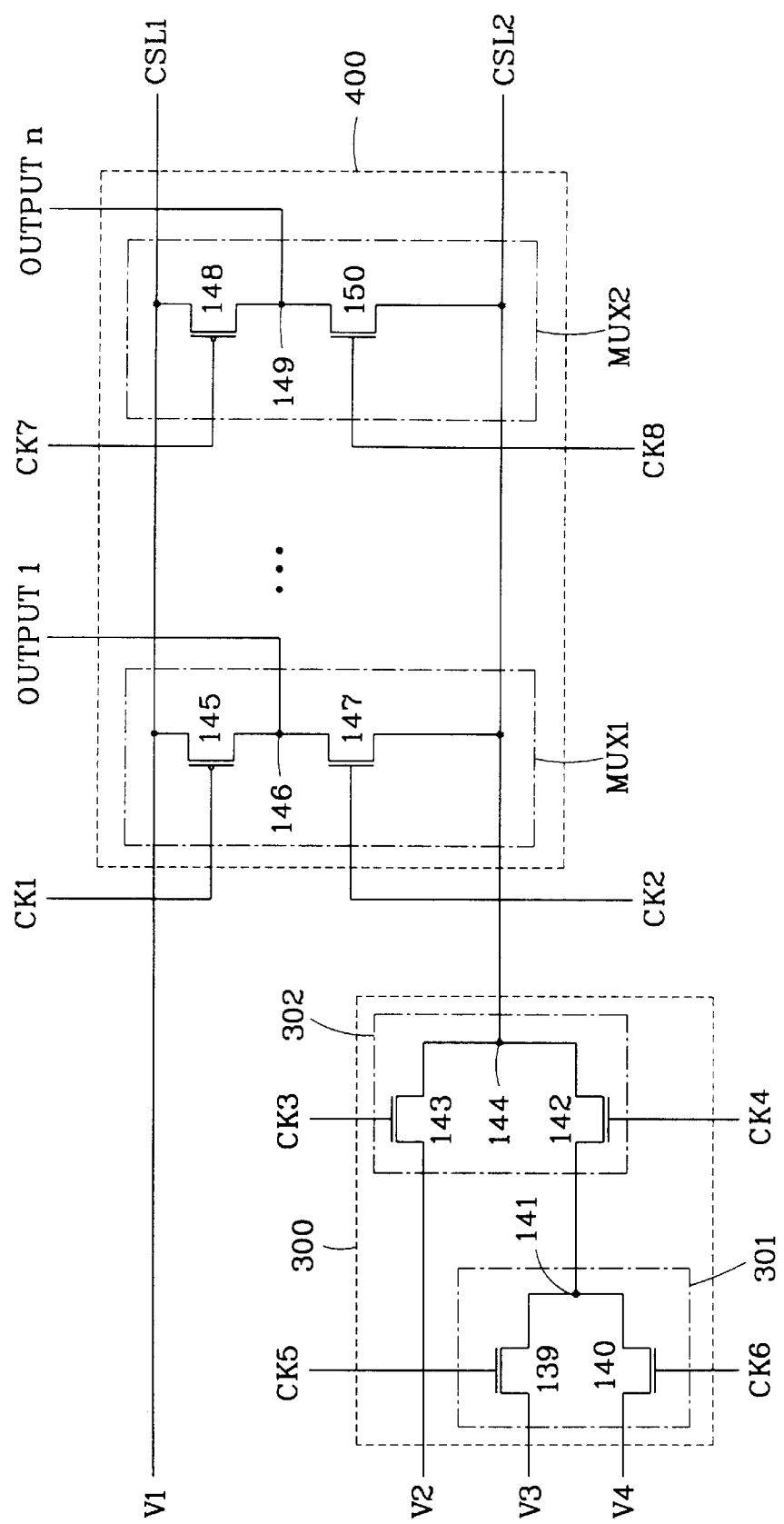
FIG. 7 is a circuit diagram showing a high-voltage analog multiplexer array circuit employing the RESURF EDMOS transistor of a fourth embodiment according to the present invention.

FIG. 7 shows a fourth embodiment of the present invention. As shown in FIG. 7, a high-voltage multiplexer having four inputs is realized when a multistage high-voltage analog multiplexer such as an LSI for driving a display is required, which includes a common multiplexer 300 having a first pass gate type multiplexer 301 for selectively outputting the externally inputted analog voltages V3 and V4 in accordance with the clock signals CK5 and CK6 applied at its gates, and a second pass gate type multiplexer 302 for receiving the output of the first multiplexer 301 and externally inputted analog voltage V2 and selectively outputting one in accordance with the clock signals CK3 and CK4 applied at its gates; and a multiplexer array unit 400 for receiving the output of the common multiplexer 300 via the common source line CSL2 and the analog voltage V1 via the common source line CSL1, and selectively outputting one in accordance with the clock signals CK applied at its gates.

The first pass gate type multiplexer 301 of the common multiplexer 300 includes a bi-directional high-voltage NMOS transistor 139 having its source receiving the analog voltage V3, its gate receiving the clock signal CK5, and its drain connected to a common node 141; and a bi-directional high-voltage NMOS transistor 140 having its source receiving the voltage V4, its gate receiving a clock signal CK6, and its drain connected to the common node 141. And the second pass gate type multiplexer 302 of the common multiplexer 300 includes a bi-directional high-voltage NMOS transistor 142 having its source connected to the common node 141, its gate receiving the clock signal CK4, and its drain connected to a common node 144; and a bi-directional high-voltage NMOS transistor 143 having its source receiving the analog voltage V2, its gate receiving the clock signal CK3, and its drain connected to the common node 144.

The multiplexer array unit 400 includes a plurality of push-pull type high-voltage analog multiplexers MUX1 through MUXn each having two inputs. The multiplexer MUX1 further includes a mono-directional high-voltage PMOS transistor 145 having its source connected to the common source line CSL1 which receives the analog voltage V1, its gate receiving the clock signal CK1, and its drain connected to a common node 146; and a bi-directional high-voltage NMOS transistor 147 having its source receiving the output of the common multiplexer 300 via the common source line CSL2, its gate receiving the clock signal CK2, and its drain connected to the common node 146.

The multiplexers MUX2 through MUXn are structurally the same as the multiplexer MUX1.

The fourth embodiment of the present invention having the above-described structure will be explained, referring to FIG. 7.

First, when the analog voltages V1, V3, V4 and V2 are inputted in order of voltage level, the first pass gate type multiplexer 301 of the common multiplexer 300 selects one of the inputted analog voltage V3 and V4 in accordance with the clock signals CK5 and CK6 respectively applied at the gates of the bi-directional high-voltage NMOS transistors 139 and 140, and outputs the selected voltage to one input terminal of the second pass gate type multiplexer 302 via the common node 141. And, the second pass gate type multiplexer 302 outputs one among the output of the first pass gate type multiplexer 301 applied at the source of the bi-directional high-voltage NMOS transistor 142 in accordance with the clock signals CK3 and CK4 respectively applied at their gates and the analog voltage V2 inputted to the source of the bi-directional NMOS transistor 143 to the plurality of push-pull type high-voltage analog multiplexers MUX1 through MUXn each having two inputs of the multiplexer array unit 400 via the common source line CSL2.

Thereafter, the plurality of the push-pull type high-voltage analog multiplexers MUX1 through MUXn each having two inputs of the multiplexer array unit 400 each select one among the output from the common multiplexer 300 inputted via the common source line CSL2 and the analog voltage V1 inputted via the common source line CSL1 in accordance with the clock signal CK applied at its gates and outputs the selected one to the respective output terminals OUT1 through OUTn.

As described above, according to the present invention, a bi-directional high-voltage RESURF EDMOS transistor endures a high voltage at its source by providing drift regions at both sides, i.e., the source and drain of the conventional RESURF LDMOS transistor, and exchanging the drain and the source when the analog signal of high voltage is inputted. Further, the bi-directional high-voltage RESURF EDMOS transistor provides a high-voltage analog multiplexer circuit employing such a RESURF EDMOS transistor which is capable of reducing the number of high-voltage elements and performing a stable operation, by constructing a high-voltage analog multiplexer having at least three inputs and a multistage high-voltage multiplexer circuit of push-pull type, pass transistor type, and combined form of push-pull type and pass transistor type by using the bi-directional high-voltage RESURF EDMOS transistor. Additionally, in the case where the multistage high-voltage multiplexer such as in an LSI for driving a display is necessary, a high-voltage multiplexer may be realized, whereby the LSI chip size is reduced in proportion to the reduced number of high voltage elements necessary and the chip resistance value for the LSI chip can be reduced.

What is claimed is:

1. A multiplexer array circuit responsive to a plurality of clock signals, comprising:
   a multiplexer array unit having a plurality of array multiplexer circuits, each array multiplexer circuit coupled to a first source line for receiving a first predetermined voltage and a common source line for receiving at least one of second, third and fourth predetermined voltages; and
      a common multiplexer for providing at least one of the third and fourth predetermined voltages to the common source line, wherein
   each array multiplexer circuit outputs one of the first, second, third and fourth predetermined voltages at an output node.

2. The multiplexer array circuit of claim 1, wherein said common source line comprises second and third source lines, and each array multiplexer circuit comprises:
   a first transistor coupled to the first source line and the output node;
   a second transistor coupled to the second source line for receiving the second predetermined voltage and coupled to said first transistor at the output node; and
   a third transistor coupled to the third source line for receiving one of the third and fourth predetermined voltages and coupled to the output node.

3. The multiplexer array circuit of claim 2, wherein said common multiplexer comprises:
   a fourth transistor coupled to the third source line and coupled for receiving the third predetermined voltage; and
   a fifth transistor coupled to the third source line and coupled for receiving the fourth predetermined voltage such that one of the third and fourth predetermined voltages is provided on the third source line.

4. The multiplexer array circuit of claim 2, wherein said first, second and third transistors are high voltage mono-directional RESURF transistors.

5. The multiplexer array circuit of claim 3, wherein said fourth and fifth transistors are high voltage bi-directional RESURF EDMOS transistors.

6. The multiplexer array circuit of claim 1, wherein each array multiplexer circuit comprises:
   a first transistor coupled to the first source line and the output node;
   a second transistor coupled to the common source line and the output node.

7. The multiplexer array circuit of claim 6, wherein said common multiplexer comprises:
   a first pass gate multiplexer receiving the third and fourth predetermined voltages; and
   a second pass gate multiplexer receiving the second predetermined voltage and coupled to the first gate multiplexer and the common source line, such that one of the second, third and fourth predetermined voltages is provided on the common source line.

8. The multiplexer array circuit of claim 7, wherein said first pass gate multiplexer comprises:
   a third transistor coupled to receive the predetermined third voltage and the second pass gate multiplexer; and
   a fourth transistor coupled to receive the predetermined fourth voltage and the second pass multiplexer.

9. The multiplexer array circuit of claim 8, wherein said second pass gate multiplexer comprises:
   a fifth transistor coupled to receive the second predetermined voltage and the common source line; and
   a sixth transistor coupled to said first pass gate multiplexer providing one of the third and fourth predetermined voltages and coupled to the common source line.

10. The multiplexer array circuit of claim 1, wherein a highest voltage level to a lowest voltage level is the first predetermined voltage, the third predetermined voltage, the fourth predetermined voltage and the second predetermined voltage.

11. The multiplexer array circuit of claim 9, wherein said first transistor is a high voltage mono-directional RESURF transistor and said second to sixth transistors are high-voltage bi-directional RESURF EDMOS transistors.

* * * * *